US011757458B1

(12) United States Patent
Anavangot et al.

(10) Patent No.: US 11,757,458 B1
(45) Date of Patent: Sep. 12, 2023

(54) DIGITAL PHASE-LOCKED LOOP CIRCUIT

(71) Applicant: Cadence Design Systems, Inc., San Jose, CA (US)

(72) Inventors: Vineeth Anavangot, Bangalore (IN); Riju Biswas, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/692,246

(22) Filed: Mar. 11, 2022

(51) Int. Cl.
*H03D 3/24* (2006.01)
*H03L 7/18* (2006.01)
*H03L 7/099* (2006.01)
*H04L 7/033* (2006.01)

(52) U.S. Cl.
CPC .......... *H03L 7/1806* (2013.01); *H03L 7/099* (2013.01); *H04L 7/033* (2013.01)

(58) Field of Classification Search
CPC ....... H03L 7/1806; H03L 7/099; H03L 7/103; H03L 7/07; H03L 7/0991; H04L 7/033; H04L 25/025; H04L 7/007
USPC ......................................... 375/373–376, 327
See application file for complete search history.

(56) References Cited

U.S. PATENT DOCUMENTS

| | | | |
|---|---|---|---|
| 5,235,622 A * | 8/1993 | Yoshida | H04L 7/007 |
| | | | 329/307 |
| 10,050,774 B1 * | 8/2018 | Azenkot | H04L 25/025 |
| 10,439,624 B2 | 10/2019 | Schober | |
| 11,057,040 B2 * | 7/2021 | Jung | H03L 7/07 |
| 2011/0148490 A1 * | 6/2011 | Lee | H03L 7/103 |
| | | | 327/159 |
| 2019/0165794 A1 | 5/2019 | Ott | |
| 2020/0328750 A1 * | 10/2020 | Brandonisio | H03L 7/0991 |

FOREIGN PATENT DOCUMENTS

EP    2 782 255 A1    9/2014

OTHER PUBLICATIONS

Zanuso, et al., "Noise Analysis and Minimization in Bang-Bang Digital PLLs", IEEE Transactions on Circuits and Systems—II: Express Briefs, vol. 56, No. 11, Nov. 2009.
Seol, et al., "A Reference Oversampling Digital Phase-Locked Loop with -240 dB FOM and -80 dBc Reference Spur", 2019 Symposium on VLSI Circuits Digest of Technical Papers, 978-4-86348-718-5 © 2019 JSAP.

* cited by examiner

*Primary Examiner* — Phuong Phu
(74) *Attorney, Agent, or Firm* — Foley & Lardner LLP

(57) ABSTRACT

In some examples, a digital phase-locked loop (PLL) circuit can include a switch to provide a reference input signal having a first frequency in response to an output signal having a second frequency that is greater than the first frequency. The circuit includes a comparator to provide a series of bits based on the reference input signal and a comparator reference signal, and proportional accumulator circuits to provide during respective different time intervals a proportional bit based on a respective bit of the series of bits and a previously outputted proportional bit by a respective proportional accumulator circuit. The circuit includes shift registers to shift the respective bit of the series to provide a shifted bit during the respective different time intervals, and a cancellation circuit to output a filtered proportional bit during the respective different time intervals based on the proportional bit and the shifted bit.

20 Claims, 5 Drawing Sheets

DIGITAL PHASE-LOCKED LOOP CIRCUIT

TECHNICAL FIELD

The present disclosure relates to a digital phase-lock loop (PLL) circuit.

BACKGROUND

A traditional PLL architecture contains a frequency divider (divide-by-N), a phase detector (PD)/charge-pump (CP), a loop filter (LF), and a voltage controlled oscillator (VCO). PLLs are widely employed in radio, telecommunications, computers, and other electronic applications. For example, PLLs can be used to demodulate a signal, recover a signal from a noisy communication channel, or distribute precisely timed clock pulses in digital logic circuits such as microprocessors. Since a single integrated circuit (IC) can provide a complete phase-locked-loop building block, such a technique can be used in electronic devices, with output frequencies from a fraction of a hertz (Hz) up to gigahertz (GHz).

SUMMARY

The present disclosure relates to a digital PLL circuit.

In an example, a circuit can include a switch that can be configured to provide a reference input signal having a first frequency in response to an output signal having a second frequency that is greater than the first frequency. The circuit includes a comparator that can be configured to provide a series of bits based on the reference input signal and a comparator reference signal and proportional accumulator circuits that can be configured to provide during respective different time intervals a proportional bit based on a respective bit of the series of bits and a previously outputted proportional bit by a respective proportional accumulator circuit. The proportional bit can have an instantaneous value and an average value. The circuit includes shift registers that can be configured during the respective different time intervals to shift the respective bit of the series to provide a shifted bit, and a cancellation circuit that can be configured to output a filtered proportional bit during the respective different time intervals based on the proportional bit and the shifted bit to remove the average value from the proportional bit.

In yet another example, a system can include a transmitter that can be configured to provide a data stream based on a clock signal, the clock signal being generated by a digital PLL circuit. The digital PLL circuit can include a switch configured to provide a reference input signal having a first frequency in response to the clock signal being provided by the digital PLL circuit. The clock signal can have a second frequency that is greater than the first frequency. The digital PLL circuit can include a comparator that can be configured to provide a series of bits based on the reference input signal and a comparator reference signal. The digital PLL circuit can include proportional accumulator circuits configured to provide during respective different time intervals a proportional bit based on a respective bit of the series of bits and a previously outputted proportional bit by a respective proportional accumulator circuit. The proportional bit can have an instantaneous value and an average value. The digital PLL circuit can include shift registers configured during the respective different time intervals to shift the respective bit of the series to provide a shifted bit, and a cancellation circuit that can be configured to output a filtered proportional bit during the respective different time intervals based on the proportional bit and the shifted bit to remove the average value from the proportional bit. The digital PLL circuit can include a digital controlled oscillator (DCO) configured to provide the clock signal based at least on the respective filtered proportional bit with a similar frequency as the reference input signal.

In a further example, a digital PLL circuit can include a DCO having an input and an output, and a cancellation circuit having first and second inputs and an output. The output of the cancellation circuit can be coupled to the input of DCO. The circuit includes a switch having an input coupled to the output of the DCO and an output. The circuit includes a comparator having a first input coupled to the output of the switch, a second input coupled to the output of the DCO, and an output. The circuit includes proportional accumulator circuits having respective first inputs coupled to the output of the comparator, respective second inputs coupled to respective outputs of a frequency synthesizer circuit, and respective outputs coupled to the first input of the cancellation circuit. The circuit includes shift registers having respective first inputs coupled to the respective outputs of the frequency synthesizer circuit, respective second inputs coupled to the output of the comparator, and respective outputs coupled to the second input of the cancellation circuit.

DETAILED DESCRIPTION

Figure 1:
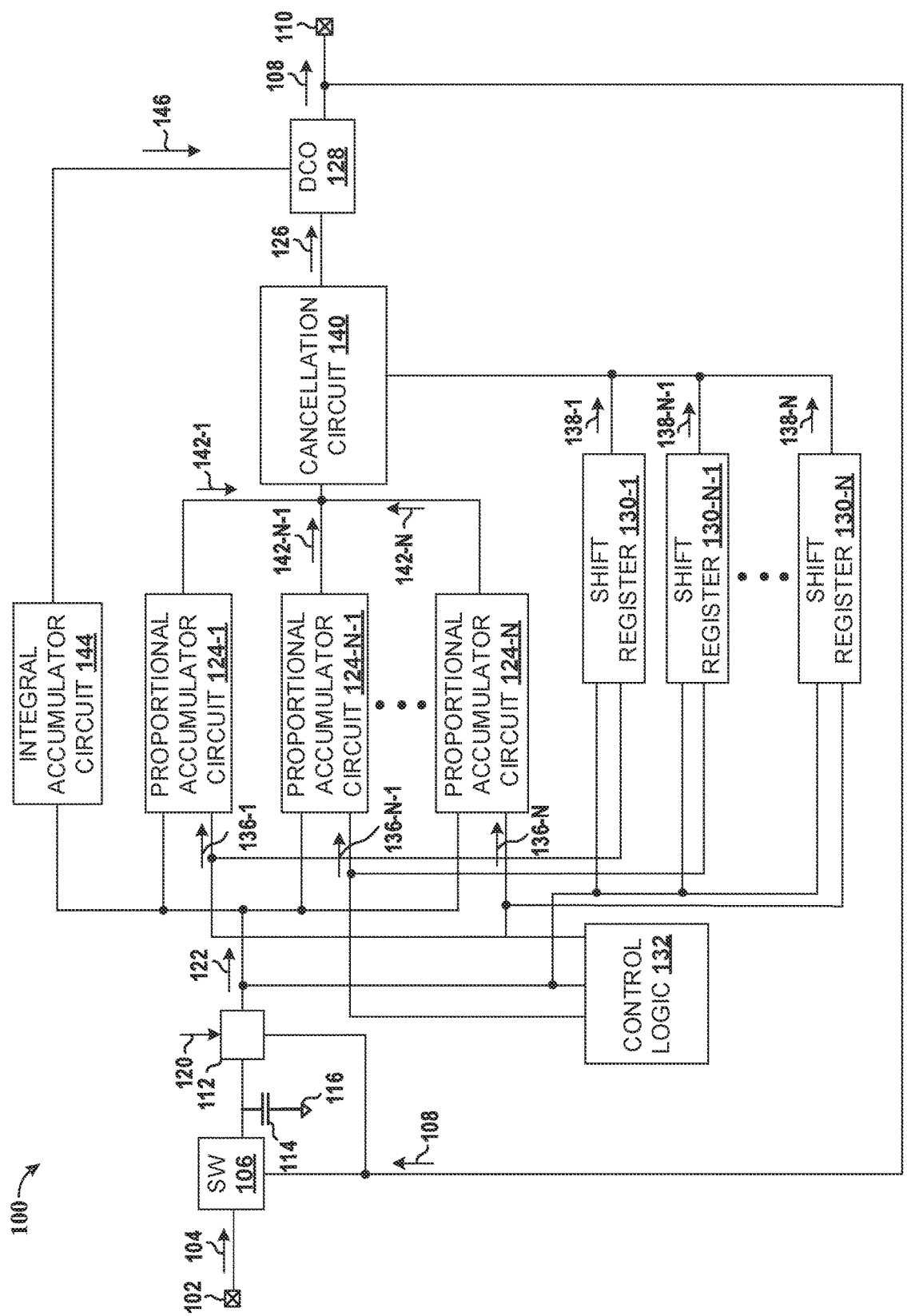
FIG. 1 is an example of a digital PLL.

The present disclosure relates to a PLL. In a conventional PLL, main loop noise sources are usually at a PD/CP and a frequency divider. Due to the presence of the frequency divider in a feedback path, PD/CP and divider noise (in power) are multiplied when transferred to a PLL output. To overcome the PD/CP and divider noise, sub-sampling (SS) can be used. A SS PLL is a type of PLL architecture that eliminates the frequency divider that is used in the conventional PLL. The SS PLL operates directly on an output signal outputted by a VCO of the SS PLL. The SS PLL uses a sampling or sample-and-hold PD to sub-sample the output signal and thus operates directly on a phase of the output signal instead of on a phase of a divided signal (as in the conventional PLL). Hence, divider noise and power dissipation are eliminated.

SS PLL can be implemented in a digital domain and thus the SS PLL can be referred to as a digital PLL. In such configurations, a bang-bang (BB) PD (BBPD) is used for phase detection. In a digital PLL design, the VCO is implemented as a DCO. The BBPD is configured to output a logical zero if a reference input signal lags in phase the output signal generated by the DCO. The BBPD can be configured to output a logical one if the reference signal leads in phase the output signal. The BBPD introduces quantization noise and spurs (e.g., at reference frequencies) into a logical signal (e.g., the logical zero or one), which reduces accurate phase lock.

An oversampled digital PLL is presented herein that attenuates spurs by pushing the spurs to higher-order frequencies. The oversampled digital PLL is configured to spread quantization noise (e.g., quantization errors) across a frequency (fosc) of an output signal of the oversampled digital PLL compared to the existing digital PLL, which spreads the quantization error across a frequency (fref) of the reference input signal. As such, the oversampled digital PLL can spread the quantization error across a frequency range from about −fosc/2 to about +fosc/2 compared to the existing digital PLL, which spreads the quantization error across a frequency range from about −fref/2 to about +fref/2. Thus, the oversampled digital PLL suppresses an inband quantization noise by an oversampling ratio (OSR) factor. Moreover, because the oversampled digital PLL captures phase error information at a frequency of the output signal, a loop bandwidth of the oversampled digital PLL can be at least fosc/10. Thus, the oversampled digital PLL has a greater loop bandwidth in contrast to the existing digital PLL and thus suppresses DCO phase noise.

Furthermore, in some examples, the oversampled digital PLL uses a 1-bit quantizer to quantize the reference input signal based on the output signal. With a 1-bit quantizer (e.g., for phase detection), direct current (DC) offset correction can be reduced for a single sampler when compared to the existing digital PLL, which uses a greater number of samplers for offset correction. Because the oversampled digital PLL in some instances uses the 1-bit quantizer eliminates a need for multi-phase clock generation and thus eliminates phase and gain mismatch errors in a time-interleaved design, as found in existing digital PLLs. For example, in delta-sigma analog-to-digital converter (ADC) used in existing digital PLLs both oversampling and noise-shaping is implemented using an integrator and a comparator in a phase loop. In the oversampled digital PLL described herein, the DCO functions as the integrator in the phase loop. Thus, the oversampled digital PLL in some implementations can be configured to allow for noise-shaping.

FIG. 1 is an example of a digital PLL 100. The digital PLL 100 can be implemented in a Field Programmable Gate Array (FPGA) device or an IC (e.g., an application-specific integrated circuit (ASIC) or system-on-chip (SoC)). As an example, the digital PLL 100 can be used for clock synchronization. The digital PLL 100 can be used in any system that uses a PLL for operation. By way of further example, the digital PLL 100 can be used in a high-speed serial link (e.g., for communication of data between a microprocessor and a memory device, such as described herein).

The digital PLL 100 can include an input node 102 to receive a reference input signal 104. The reference input signal 104 can be provided by a reference oscillator circuit (not shown in FIG. 1). The reference input signal 104 can correspond to a reference clock signal, in some instances. Thus, in some examples, the reference input signal 104 can be provided by a reference clock circuit, such as described herein. The digital PLL 100 includes a switch 106 that can be activated (e.g., actuated) in response to an output signal 108 provided by the digital PLL 100. As shown in the example of FIG. 1, the output signal 108 can be provided to an output node 110. The digital PLL 100 as described herein can provide the output signal 108 with a phase that is related to a phase of the reference input signal 104. The output signal 108 can have a frequency (fosc) that is an "N" multiple of a frequency (fref) of the reference input signal 104. In the examples herein "N" can refer to or be representative of an integer value. As an example, "N" can refer to an integer value that is greater than or equal to ten (10). The output signal 108 can have a frequency that is fref/N of the reference input signal 104. The output signal 108 can be used for sampling the reference input signal 104. Because the frequency of the output signal 108 is N times greater than the frequency of the reference input signal 104, the digital PLL 100 can be configured to oversample the reference input signal 104.

For instance, to sample the reference input signal 104 for phase correction, the output signal 108 can be provided to the switch 106 and a comparator 112. During each logical high value (e.g., representative of a high voltage, such as 1 volt (V)) of the output signal 108, the switch 106 can be activated to close to provide the reference input signal 104 to the comparator 112. A capacitor 114 with a capacitance can be coupled between the switch 106 and the comparator 112 and a ground 116. The capacitor 114 can be used to attenuate higher-order frequencies of the reference input signal 104.

In some instances, the comparator 112 can be configured to receive a comparator reference signal 120. The comparator 112 can be configured to compare the reference input signal 104 to the comparator reference signal 120 (e.g., based on the output signal 108, for example, on a falling edge or a rising edge of the output signal 108) and output a digital representation that can take one of a first value (e.g., a logical one) or a second value (e.g., a logical zero). For example, if the reference input signal 104 is greater than the comparator reference signal 120, the comparator 112 can output a first digital signal (e.g., the logical zero). In some instances, if the reference input signal 104 is less than the comparator reference signal 120, the comparator 112 can output a second digital signal (e.g., the logical one). A digital signal outputted by the reference signal 122 can be referred to as a bit and thus can take on one of the first or second values. The comparator 112 can be configured to output an "N" number of bits 122 based on the reference input signal 104. For example, referred to herein as a "given example," the comparator 112 can be configured to output six (6) bits during each logical high value of the output signal 108. Each bit can representative at an instance of time an amplitude of the reference input signal 104.

In some instances, the comparator 112 can be a 1-bit or a 2-bit quantizer and thus can be referred to as a quantizer 112. The quantizer 112 can be configured to map an input amplitude to an output amplitude, wherein the output amplitude takes on a number of allowed values (e.g., one of the first and second values). Examples are described herein wherein the quantizer 112 is implemented as a 1-bit quantizer, however, in other examples, a 2-bit quantizer can be used. The quantizer 112 can be representative of a sign function, wherein, $\varepsilon(t) \geq 0 y(n)=1$, else $y(n)=0$. The quantizer 112 is used on the output signal 108 and thus is working at an oversampling frequency. Accordingly, the quantizer 112 can function as a sampler and sample the reference input signal 104 at a greater frequency than the frequency of the reference input signal 104.

During operation, the digital PLL 100 can be configured to store each bit of the bits 122 in a respective proportional accumulator circuit 124. The digital PLL 100 can include N number of proportional accumulator circuits 124. For instance, in the given example, each bit of the bits 122 can be stored in one six (6) proportional accumulator circuits 124. Each bit of the bits 122 can have a respective instantaneous value and an average value. The quantizer 112 is configured to sample the reference input signal 104 at an instance of time based on a respective edge (e.g., rising edge) of the output signal 108. However because of perturbations and noise, a sampling time of the quantizer 112 can shift away from a desired sampling time. Thus, the quantizer 112 can deviate from a desired sample time for sampling the reference input signal 104. This deviation from the desired instance of time to another sampling time is known as a delta change of a phase between the reference input signal 104 and the output signal 108.

During each sampling of the reference input signal 104 at a corresponding sampling time, an amplitude of the reference input signal 104 can change. For example, at the desired sampling time, the reference input signal 104 can have a known amplitude. Because of the perturbations and the noise, the quantizer 112 once shifted to the other sampling time can sample the reference input signal 104 with a different amplitude from the known amplitude (or expected amplitude at the desired sampling time). In some instances, wherein the reference input signal 104 is sampled by the quantizer 112 at a non-desired instance of time (e.g., the other sampling time) relative to the output signal 108 an amplitude of the reference input signal at that time is captured as the instantaneous value. Thus, the instantaneous value corresponds to the instantaneous phase perturbation or the instantaneous phase difference between the reference input signal 104 and the output signal 108. Because the reference input signal 104 has a DC component, a respective bit generated by the quantizer 112 can have a DC component corresponding to the average value. The average value can be a DC value and thus correspond to a DC component of each bit. The DC component can function as an offset of each bit of the bits 122. As described herein, the digital PLL 100 can be configured to cancel out the average value from each bit of the bits 122 to provide filtered proportional bits 126 free from the DC component. Each of the filtered proportional bits 126 can be provided to a DCO 128, as described herein.

For canceling the average value in each bit of the bits 122, the digital PLL 100 includes for each proportional accumulator circuit 124 a respective shift register 130. The digital PLL 100 can include N number of shift registers 130. The digital PLL 100 includes control logic 132. The control logic 132 can be representative of hardware for implementing logical functions and/or controls as described herein. In some examples, the control logic 132 can be representative of a microcontroller unit (MCU). The control logic 132 can be configured to control a timing for average value cancellation for each bit of the bits 122.

The control logic 132 can be configured to receive each of the bits 122 outputted by the comparator 120. As shown in FIG. 1, each of bits 122 can be provided to one of the shift registers 130 during a respective time interval over a time frame. Operations of the proportional accumulator circuits 124, and corresponding shift registers 130 can be controlled based on a respective frequency reference signal of an N number of frequency reference signal 136. The frequency reference signals 136 can be provided by a frequency synthesizer circuit (or frequency divider circuit), such as described herein.

In some instances, the control logic 132 includes the frequency synthesizer circuit and thus can provide the frequency reference signals 136. In other instances, the control logic 132 can control at an instance of time at which the frequency synthesizer circuit provides a corresponding frequency reference signal 136. Each of the frequency reference signals 136 can have a different on-duty time over a respective time frame. That is, during a corresponding time interval during the respective time frame one of the frequency reference signals 136 has a logical high value while other remaining frequency reference signals can have a logical low value (e.g., representative of a low voltage, such as 0 V). In some instances, a start time of a given time interval for a given frequency reference signal can be at about an end time of another time interval for another frequency reference signal. Thus, in some examples, there may be time interval overlap at the start and end times of respective time intervals.

For instance, in the given example, a first frequency reference signal can have a logical high value during a first time interval while second, third, fourth, fifth, and sixth frequency references signals have a logical low value. During a second time interval, in the given example, the second frequency reference signal can have the logical high value, and the first, third, fourth, fifth, and sixth frequency references signals have the logical low value. By way of further example, during a third time interval, in the given example, the third frequency reference signal can have the logical high value, and the first, second, fourth, fifth, and sixth frequency references signals have the logical low value.

In further examples, each shift register 130 of the digital PLL 100 can function as a time delay circuit with an amount of delay being controlled by a number of stages (e.g., flip-flops (FF)) of a respective shift register. The amount of delay provided by each shift register 130 can be such that a respective shifted bit of an N number of shifted bits 138 outputted by a respective shift register 130 arrives at a cancellation circuit 140 at about a same time as a proportional bit of an N number of proportional bit 142 outputted by a respective proportional accumulator circuit 124.

For example, during operation of the digital PLL 100, the frequency reference signals 136 can be provided during a respective different time interval to one of the proportional accumulator circuits 124, and one of the shift registers 130 to enable respective accumulator and shift operations. For instance, during a first time interval, the frequency reference signal 136-1 can be provided to the proportional accumulator circuit 124-1 and the shift register 130-1. The proportional accumulator circuit 124-1 can store a first bit of the bits 122 and the shift register 130-1 can store the first bit of the bits 122 during the first time interval based on the frequency reference signal 136-1. In further examples, during a second time interval, the frequency reference signal 136-N-1 can be provided to the proportional accumulator circuit 124-N-1 and the shift register 130-N-1. The proportional accumulator circuit 124-N-1 can store a second bit of the bits 122 and the shift register 130-N-1 can store the second bit of the bits 122 during the second time interval based on the frequency reference signal 136-N-1.

In further examples, during each N-1 subsequent time interval until the Nth time interval during a respective time frame, a respective frequency reference signal 136 can be provided to a respective proportional accumulator circuit 124 and shift register 130. The respective proportional accumulator circuit 124 and shift register 130 can store an N bit of the bits 122 based on the respective frequency reference signal 136. There can be an N number of time intervals during which a respective frequency reference signal 136 is provided to a respective proportional accumulator circuit 124 and shift register 130. For instance, in the given example, there are six (6) time intervals (e.g., N =6) during which one of first, second, third, fourth, fifth, and sixth frequency reference signals are provided to a corresponding proportional accumulator circuit 124 and shift register 130.

In a subsequent time frame (e.g., that includes the N number of time intervals), a subsequent bit of the bits 122 can be added to a previously stored bit at one of the proportional accumulator circuits 124 and thus can be accumulated therein (with a previously stored bit from a prior time frame) to provide the proportional bit 142-1. For example, during the first time interval during a first time frame, the proportional accumulator circuit 124-1 can store a first bit of the bits 122 based on the frequency reference signal 136-1. During a subsequent first time interval during a second time frame, the proportional accumulator circuit 124-1 can add a subsequent first bit of subsequent bits provided by the comparator 120 as the bits 122 to the stored first bit based on the frequency reference signal 136-1 to provide the proportional bit 142-1. Accordingly, each proportional accumulator circuit 124 accumulates respective bits of the bits 122 (e.g., the first bit of the bits 122 is added to the first bit of subsequent bits, the second bits of the bits 122 is added to the second bit of the subsequent bits, etc.) during each respective time interval for a number of time frames.

By way of further example, the cancellation circuit 140 can be configured during a respective time interval to subtract from one of the proportional bits 142 one of the shifted bits 138 to provide a respective filtered proportional bit of the filtered proportional bits 126. The cancellation circuit 140 can be configured to remove an average value from each of the proportional bits 142 and based on a respective one of the shifted bits 138. For example, during the respective time interval, the cancellation circuit 140 can be configured to subtract the shift bit 138-1 from the proportional bit 142-1 to provide a first filtered proportional bit of the filtered proportional bits 126. During a subsequent time interval, the cancellation circuit 140 can be configured to subtract the shifted bit 138-N-1 from the proportional bit 142-N-1 to provide a second filtered proportional bit of the filtered proportional bits 126. During a further subsequent time interval, the cancellation circuit 140 can be configured to subtract the shifted bit 138-N from the proportional bit 142-N to provide a third filtered proportional bit of the filtered proportional bits 126. Thus, each filtered proportional bit of the filtered proportional bits 126 can be provided during a corresponding time interval over a given time frame. In the given example, first, second, third, fourth, fifth, and sixth filtered proportional bits can be provided during a corresponding first, second, third, fourth, fifth, and sixth time interval to the DCO 128.

In further examples, the digital PLL 100 includes an integral accumulator circuit 144. During each time frame, the integral accumulator circuit 144 can accumulate the bits 122 as each respective bit is provided by the comparator 120 to provide an integral bit 146. The integral bit 146 can be representative of an average of subsequent bits of the bits 122 over a rolling time frame window. For example, during the second time interval of a respective time frame, the integral accumulator circuit 144 can receive the second bit of the bits 122 and add the second bit to a stored first bit of the bits 122 (received during the first time interval of the respective time frame and corresponds to a previously provided integral bit) to provide the integral bit 146. By way of further example, during the third time interval of the respective time frame, the integral accumulator circuit 144 can receive the third bit of the bits 122 and add the third bit to a stored second bit of the bits 122 (received during the second time interval of the respective time frame and corresponds to a previously provided integral bit) to provide the integral bit 146. The integral bit 146 can be provided to the DCO 128. The DCO 128 can employ each filtered proportional bit 126 and the integral bit 146 for adjusting a phase of the output signal 108 to match the phase of the reference input signal 104.

Accordingly, the digital PLL 100 can spread quantization noise (e.g., quantization errors) across a frequency (fosc) of the output signal 108 when compared to an existing digital PLL, which spreads the quantization error across a frequency (fref) of a reference input signal. As such, the digital PLL 100 can spread the quantization error across from about −fosc/2 to about +fosc/2 compared to the existing digital PLL, which spreads the quantization error from about −fref/2 to about +fref/2. Thus, the digital PLL 100 suppresses an inband quantization noise by an OSR factor. Moreover, because the digital PLL 100 captures phase error information at a frequency of the output signal 108, a loop bandwidth of the digital PLL 100 can be at least fosc/10. Thus, the digital PLL 100 has a greater loop bandwidth in contrast to the existing digital PLL. The increase in loop bandwidth suppresses DCO phase noise. Furthermore, in some instances, as described herein, the comparator 112 of the digital PLL 100 is a 1-bit quantizer. With a 1-bit quantizer, offset correction is reduced for a single sampler when compared to the existing digital PLL, which uses a greater number of samplers for offset correction. Because the digital PLL 100 can use a 1-bit quantizer eliminates a need for multi-phase clock generation and thus eliminates phase and gain mismatch errors in a time-interleaved design, as found in existing digital PLLs.

Figure 2:
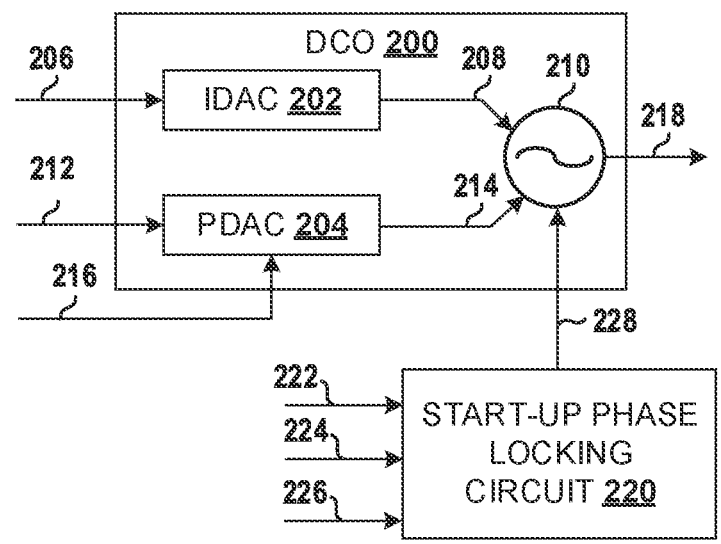
FIG. 2 is an example of a DCO.

FIG. 2 is an example of a DCO 200. The DCO 200 can be the DCO 128, as shown in FIG. 1. Thus, in some examples, references can be made to the example of FIG. 1 in the description with respect to FIG. 2. The DCO 200 can include an integral digital-to-analog converter (IDAC) 202 and a proportional DAC (PDAC) 204. The IDAC 202 can be configured to receive an integral bit 206 generated by an integral accumulator circuit (e.g., the integral accumulator circuit 144, as shown in FIG. 1). The integral bit 206 can be a sum of subsequent bits (e.g., neighboring bits of the bits 122, as shown in FIG. 1). The IDAC 202 can be configured to convert the integral bit 206 into an analog representation to provide a first analog signal 208 to control an oscillator circuit 210.

The PDAC 204 can be configured to receive a filtered proportional bit 212 (e.g., one of the filtered proportional bits 126, as shown in FIG. 1) representative of a phase error corresponding to an instantaneous value. The PDAC 202 can be configured to convert the filtered proportional bit 212 into a second analog signal 214 to control the oscillator circuit 210. In some examples, the PDAC 204 can be configured to receive a digital proportional gain adjustment signal 216. The digital proportional gain adjustment signal 216 can be used for loop tuning to increase or decrease a proportional gain of the digital PLL 100. In some instances, the digital proportional gain adjustment signal 216 can be provided by control logic, such as the control logic 132, as shown in FIG. 1. The digital proportional gain adjustment signal 216 can be provided for each sample of a reference input signal (e.g., the reference input signal 104, as shown in FIG. 1) for adjusting a gain of a corresponding filtered proportional bit 212 that is based on a respective sample. For example, the reference input signal can have a positive cycle and a negative cycle. After the reference input signal is locked to an output signal of the digital PLL (e.g., the output signal 108, as shown in FIG. 1), it is known at which instances in time the reference input signal is being sampled. Because this information is known, it is known whether a comparator of the digital PLL (e.g., the comparator 112, as shown in FIG. 1) is sampling on the positive or negative cycle of the reference input signal. Based on a respective sampling point with respect to the reference input signal, provided as a bit of the bits (e.g., the bits 122, as shown in FIG. 1) the control logic can provide a respective gain adjustment for the filtered proportional bit 212. The respective gain adjustment for each corresponding sampling point can be based on a slope of the reference input signal at an instance of time at about the respective sampling point.

The oscillator circuit 210 can be configured to generate an output signal 218 (e.g., the output signal 108, as shown in FIG. 1.) based on the first and second analog signals 206 and 208 with a phase similar to a phase of a reference input signal 222 (e.g., the reference input signal 104, as shown in FIG. 1) to the digital PLL.

In a startup phase, a start-up phase locking circuit 220 can be enabled to lock the output signal 218 to the reference input signal 222. Once locked, the start-up phase locking circuit 220 can be disabled (e.g., by the control logic 132, as shown in FIG. 1). In some examples, the DCO 200 includes the start-up phase locking circuit 220. The start-up phase locking circuit 220 can receive a lock enable signal 224 (e.g., provided by the control logic 132, as shown in FIG. 1). The lock enable signal 224 can cause the start-up phase locking circuit 220 to be enabled. Once enabled, the start-up phase locking circuit 220 can compare the reference input signal 222 to a target output signal 226 to determine a phase error. The target output signal 226 can be provided by the control logic 132, as shown in FIG. 1. The start-up phase locking circuit 220 can be configured to provide a start-up phase error signal 228 to the oscillator circuit 210 for the generation of the output signal 218. In some examples, the start-up phase error signal 228 is a digital signal, and the DCO 200 includes a DAC for providing a corresponding analog signal to the oscillator circuit 210.

Figure 3:
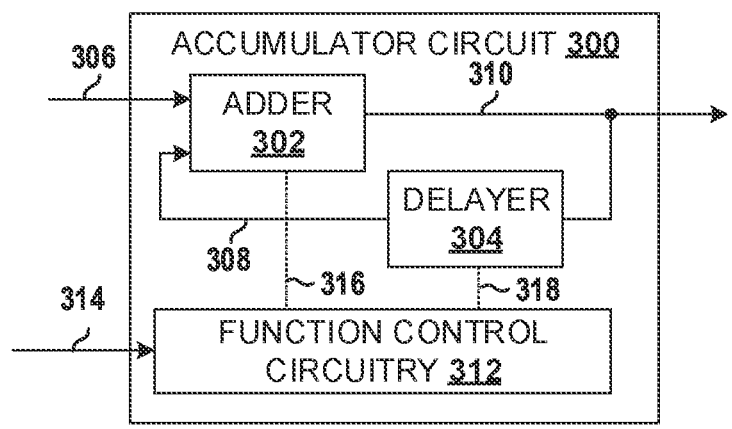
FIG. 3 is an example of an accumulator circuit.

FIG. 3 is an example of accumulator circuit 300. The accumulator circuit 300 can be representative of an accumulator circuit such as described herein with respect to FIG. 1. Thus, in some examples, references can be made to the example of FIGS. 1-2 in the description with respect to FIG. 3. The accumulator circuit 300 includes an adder 302 and a delayer 304. The adder 302 can be configured to receive a bit 306, such as generated by a comparator (e.g., the comparator 112, as shown in FIG. 1). The adder 302 can receive a delayed bit 308, such as previously generated by the comparator. The adder 302 can add the bit 306 and the delayed bit 308 to provide a combined bit 310. The combined bit 310 can be fed back to the delayer and added to a subsequent bit generated by the comparator. Thus, as the accumulator circuit 300 receives additional bits from the comparator the combined bit 310 can be updated. For example, if the accumulator circuit 300 is representative of each respective proportional accumulator circuit 124, the combined bit 310 can be representative of the proportional bit 142. If the accumulator circuit 300 is representative of the integral accumulator circuit 144, the combined bit 310 can be representative of the integral bit 146, as shown in FIG. 1.

In further examples, the accumulator circuit 300 includes function control circuitry 312 to enable operations (e.g., addition and delaying of bits) of the accumulator circuit. The function control circuit 312 can receive a frequency reference signal 314 (e.g., one of the frequency reference signals 136, as shown in FIG. 1). The function control circuit 312 can enable or cause (shown with a dashed line 316 in the example of FIG. 3) the adder 302 to add the bit 306 and the delayed bit 308 to provide the combined bit 310 in response to the frequency reference signal 314. The function control circuit 312 can enable or cause (shown with a dashed line 318 in the example of FIG. 3) the delayer 304 to delay in time (e.g., at least one time interval) a bit to provide the delayed bit 308 in response to the frequency reference signal 314. In some examples, the function control circuit 312 can be omitted and the frequency reference signal 314 can be provided to each of the adder 302 and delayer 304 to enable respective add and delay operations as described herein.

Figure 4:
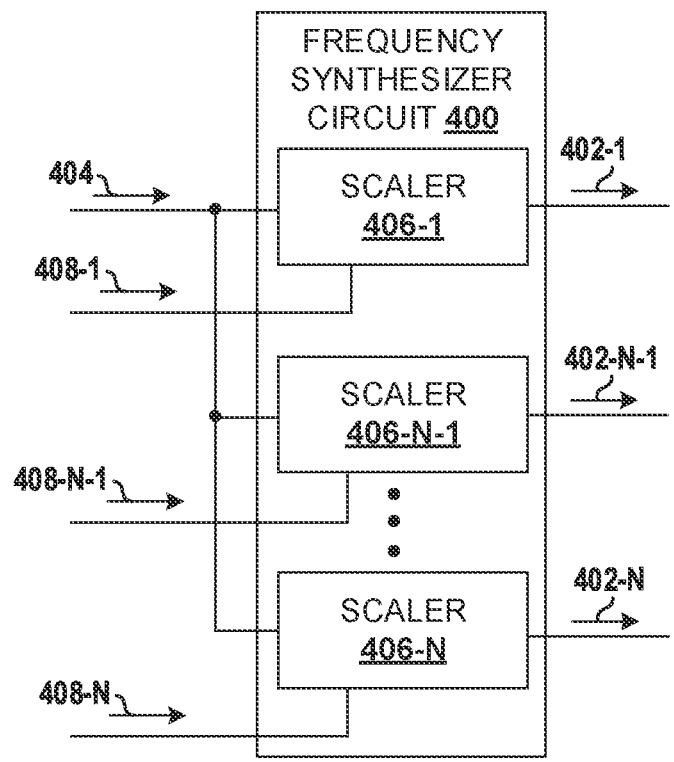
FIG. 4 is an example of a shift register.

FIG. 4 is an example of a frequency synthesizer circuit 400. The frequency synthesizer circuit 400 can be configured to provide an N number frequency reference signals 402 based on an output signal 404 (e.g., the output signal 108, as shown in FIG. 1) provided by a digital PLL, such as the digital PLL 100, as shown in FIG. 1. Thus, in some examples, references can be made to the example of FIGS. 1-3 in the description with respect to FIG. 4. The frequency synthesizer circuit 400 can be implemented as a multi-output frequency reference input signal generation circuit. In some instances, the frequency synthesizer circuit 400 can be implemented as part of the control logic 132, as shown in FIG. 1. In other examples, the frequency synthesizer circuit 400 can be implemented separately from the control logic 132.

The frequency synthesizer circuit 400 can include an N number of scalers 406. For instance, in the given example, as described herein, the frequency synthesizer circuit 400 includes six (6) scalers. Each of the scalers 406 can be configured to receive the output signal 404. The scalers 406 can be configured to provide a respective frequency reference signal of an N number of frequency reference signals 402 based on the output signal 404. The frequency reference signals 402 can be provided to a respective proportional accumulator (e.g., one of the proportional accumulator circuits 124, as shown in FIG. 1) and a respective shift register (e.g., one of the shift registers 130, as shown in FIG. 1), as described herein. In some examples, each of the scalers 406 can be enabled to provide the respective frequency reference signal 402 in response to receiving a respective scaler enable signal of an N number of scaler enable signals 408. The scaler enable signals 408 can be generated by control logic (e.g., the control logic 132, as shown in FIG. 1). Thus, the scaler enable signals 408 can control whether a respective scaler 406 provides a given frequency reference signal 402.

Figure 5:
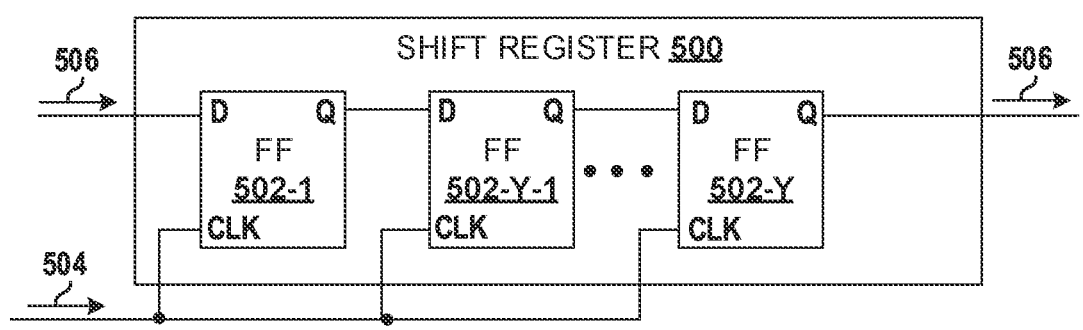
FIG. 5 is an example of a frequency synthesizer circuit.

FIG. 5 is an example of a shift register 500. The shift register 500 can be representative of a respective shift register as shown in FIG. 1, such as the shift registers 130. Thus, in some examples, references can be made to the example of FIGS. 1-4 in the description with respect to FIG. 5. The shift register 500 includes a Y number of FFs 502, wherein Y is an integer value representative of a number of stages. The number of stages of the shift register 500 can define an amount of delay that is to be applied to an input bit (e.g., one of the bits 122, as shown in FIG. 1) and thus delay in time the input bit.

The shift register 500 can receive a frequency reference signal 504 (e.g., one of the reference input signals 136, as shown in FIG. 1). Each of the FFs 502 of the shift register 500 can receive the reference input signal 504 at a respective clock input (labeled as "CLK"). Each of the FFs 502 can be edged triggered (e.g., on the rising or falling edge) based on the frequency reference signal 504.

For example, the FF 502-1 can receive a bit 506 (e.g., one of the bits 122, as shown in FIG. 1). The bit 506 can be provided to a data input (labeled as "D") of the FF 502-1.

The FF 502-1 can transfer input data (e.g., the bit 506) on an edge (e.g., on a rising or falling edge) of the frequency reference signal 504 to a data output (labeled as "0") of the FF 502-1, which can be received by the FF 502-Y-1. The FF 502-Y-1 receives the bit 506 at a data input (labeled as "D") and transfers the bit 506 on the edge of the frequency reference signal 504 to a data output (labeled as "Q") of the FF 502-Y-1. The FF 502-Y can receive the bit 506 at a data input (labeled as "D") and transfer the bit 506 on the edge of the frequency reference signal 504 to a data output (labeled as "Q") of the FF 502-Y. The bit 506 can be provided from the FF 502-Y to a cancellation circuit, such as the cancellation circuit 140, as shown in FIG. 1. Thus, bit 506 can be referred to as a shifted bit and correspond to one of the shifted bits 138, as shown in FIG. 1

Figure 6:
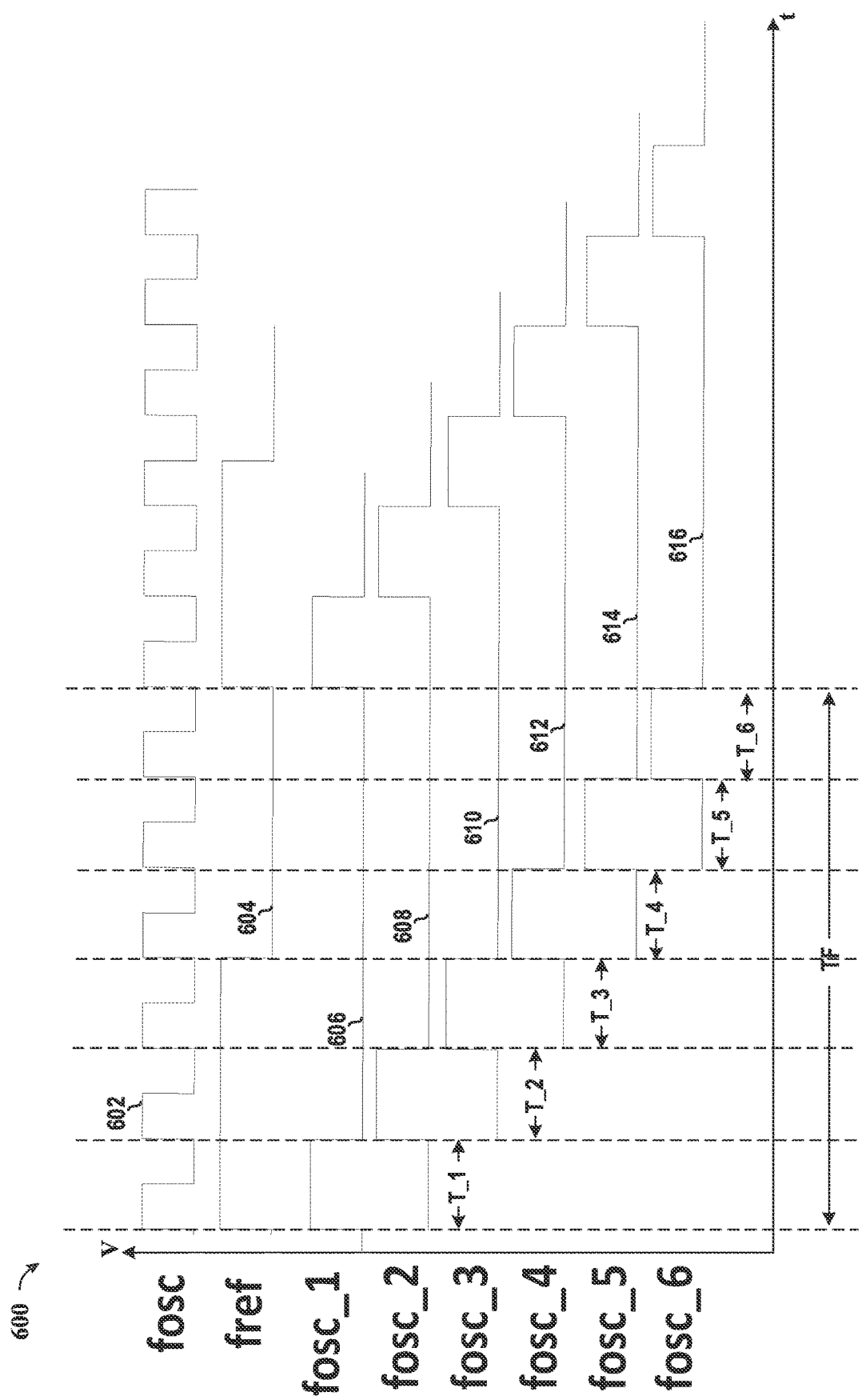
FIG. 6 is an example of a signal diagram for operating a digital PLL.

FIG. 6 is an example of a signal diagram 600 for operating a digital PLL, such as the digital PLL 100, as shown in FIG. 1. Thus, in some examples, references can be made to the example of FIGS. 1-5 in the description with respect to FIGS. 6. As shown in the example of FIG. 6, a y-axis of the diagram 600 can represent a voltage in volts (V) and an x-axis of the diagram 600 can represent time (t). The signal diagram 600 includes a reference input signal 602 (labeled as "fosc") and an output signal 604 (labeled as "fref"). The reference input signal 602 can correspond to the reference input signal 104 and the output signal 604 can correspond to the output signal 108, as shown in FIG. 1. The signal diagram 600 includes a number of frequency reference signals. In the given example, as described herein, the signal diagram 6500 includes a first frequency reference signal 606 (labeled as "fosc_1"), a second frequency reference signal 608 (labeled as "fosc_2"), a third frequency reference signal 610 (labeled as "fosc_3"), a fourth frequency reference signal 612 (labeled as "fosc_4"), a fifth frequency reference signal 614 (labeled as "fosc_5"), a sixth frequency reference signal 616 (labeled as "fosc_6"). Each of the frequency reference signals as shown in the example of FIG. 6 can be generated by a frequency synthesizer circuit, such as the frequency synthesizer circuit 400, as shown in FIG. 1.

During operation of the digital PLL 100, for instance in the given example, the frequency reference signals 606, 608, 610, 612, 614, and 616 can be provided to one of first, second, third, fourth, fifth, and sixth proportional accumulator circuits of the digital PLL 100 (e.g., one of the proportional accumulator circuits 124, as shown in FIG. 1), and to one of first, second, third, fourth, fifth, and sixth shift registers of the digital PLL 100 (e.g., one of shift registers 130, as shown in FIG. 1). Each of the proportional accumulator circuits can provide a respective first, second, third, fourth, fifth, and sixth proportional bit (e.g., one of the proportional bits 142, as shown in FIG. 1) based at least on a respective received first, second, third, fourth, fifth, and sixth bits of bits (e.g., one of the respective bits of the bits 122, as shown in FIG. 1. Each of the shift registers can provide a respective first, second, third, fourth, fifth, and sixth shifted bit (e.g., one of the shifted bits 138, as shown in FIG. 1) based at least on the respective received first, second, third, fourth, fifth, and sixth bit of bits (e.g., one of the bits 122, as shown in FIG. 1). During each respective time interval, an integral accumulator circuit (e.g., the integral accumulator circuit 144, as shown in FIG. 1) can be configured to output a respective one of first, second, third, fourth, fifth, and sixth integral bits based on received input signals.

For instance in the given example, during operation of the digital PLL 100, during a first time interval (labeled as "T_1") over a time frame (labeled as "TF"), the first frequency reference signal 606 has a logical high value (e.g., a logical one) based on the reference input signal 602 and the output signal 604. During the first time interval, the first frequency reference signal 606 can be provided to the first proportional accumulator circuit and the first shift register. The first proportional accumulator circuit can provide a first proportional bit based on the received first bit. The first shift register can shift the received first bit to provide the first shifted bit based on the first frequency reference signal 606. During the first time interval, the integral accumulator circuit can provide the first integral bit based at least on the first bit. As shown in FIG. 6, during the first time interval, the reference input signals 608, 610, 612, 614, and 616 have a logical low value (e.g., a logical zero). During the first time interval, the cancellation circuit can provide a first filtered proportional bit to a DCO (e.g., the DCO 128, as shown in FIG. 1) based on the first proportional bit and the first shifted bit. The DCO can be configured to receive the first integral bit during the first time interval.

During a second time interval (labeled as "T_2"), the second frequency reference signal 608 has the logical high value while the reference input signals 606, 610, 612, 614, and 616 have the logical low value. During the second time interval, the second frequency reference signal 608 is provided to the second proportional accumulator circuit and the second shift register. The second proportional accumulator circuit can provide a second proportional bit based on the second received bit and the first proportional bit previously provided. The second shift register can shift the second received bit based on the second frequency reference signal 608 to provide the second shifted bit. During the second time interval, the integral accumulator circuit can provide the second integral bit based at least on the second bit and the first integral bit previously provided. During the second time interval, the cancellation circuit can provide a second filtered proportional bit to the DCO based on the second proportional bit and the second shifted bit. The DCO can be configured to receive the second integral bit during the second time interval.

During a third time interval (labeled as "T_3"), the third frequency reference signal 610 has the logical high value while the reference input signals 606, 608, 612, 614, and 616 have the logical low value. During the third time interval, the third frequency reference signal 610 is provided to the third proportional accumulator circuit and the third shift register. The third proportional accumulator circuit can provide a third proportional bit based on the third received bit and the second proportional bit previously provided. The third shift register can shift the third received bit based on the third frequency reference signal 610 to provide the third shifted bit. During the third time interval, the integral accumulator circuit can provide the third integral bit based at least on the third bit and the second integral bit previously provided. During the third time interval, the cancellation circuit can provide a third filtered proportional bit to the DCO based on the third proportional bit and the third shifted bit. The DCO can be configured to receive the third integral bit during the third time interval.

During a fourth time interval (labeled as "T_4"), the fourth frequency reference signal 612 has the logical high value while the reference input signals 606, 608, 610, 614, and 616 have the logical low value. During the fourth time interval, the fourth frequency reference signal 610 is provided to the fourth proportional accumulator circuit and the fourth shift register. The fourth proportional accumulator circuit can provide a fourth proportional bit based on the fourth received bit and the third proportional bit previously provided. The third shift register can shift the fourth received bit based on the fourth frequency reference signal 612 to provide the fourth shifted bit. During the fourth time interval, the integral accumulator circuit can provide the fourth integral bit based at least on the fourth bit and the third integral bit previously provided. During the fourth time interval, the cancellation circuit can provide a fourth filtered proportional bit to the DCO based on the fourth proportional bit and the fourth shifted bit. The DCO can be configured to receive the fourth integral bit during the fourth time interval.

During a fourth time interval (labeled as "T_4"), the fourth frequency reference signal 612 has the logical high value while the reference input signals 606, 608, 610, 614, and 616 have the logical low value. During the fourth time interval, the fourth frequency reference signal 610 is provided to the fourth proportional accumulator circuit and the fourth shift register. The fourth proportional accumulator circuit can provide a fourth proportional bit based on the fourth received bit and the third proportional bit previously provided. The fourth shift register can shift the fourth received bit based on the fourth frequency reference signal 612 to provide the fourth shifted bit. During the fourth time interval, the integral accumulator circuit can provide the fourth integral bit based at least on the fourth bit and the third integral bit previously provided. During the fourth time interval, the cancellation circuit can provide a fourth filtered proportional bit to the DCO based on the fourth proportional bit and the fourth shifted bit. The DCO can be configured to receive the fourth integral bit during the fourth time interval.

During a fifth time interval (labeled as "T_5"), the fifth frequency reference signal 614 has the logical high value while the reference input signals 606, 608, 610, 612, and 616 have the logical low value. During the fifth time interval, the fifth frequency reference signal 614 is provided to the fifth proportional accumulator circuit and the fifth shift register. The fifth proportional accumulator circuit can provide a fifth proportional bit based on the fifth received bit and the fourth proportional bit previously provided. The fifth shift register can shift the fifth received bit based on the fifth frequency reference signal 614 to provide the fifth shifted bit. During the fifth time interval, the integral accumulator circuit can provide the fifth integral bit based at least on the fifth bit and the fourth integral bit previously provided. During the fifth time interval, the cancellation circuit can provide a fifth filtered proportional bit to the DCO based on the fifth proportional bit and the fifth shifted bit. The DCO can be configured to receive the fifth integral bit during the fifth time interval.

During a sixth time interval (labeled as "T_6"), the sixth frequency reference signal 616 has the logical high value while the reference input signals 606, 608, 610, 612, and 614 have the logical low value. During the sixth time interval, the sixth frequency reference signal 616 is provided to the sixth proportional accumulator circuit and the sixth shift register. The sixth proportional accumulator circuit can provide a sixth proportional bit based on the sixth received bit and the fifth proportional bit previously provided. The sixth shift register can shift the sixth received bit based on the sixth frequency reference signal 616 to provide the sixth shifted bit. During the sixth time interval, the integral accumulator circuit can provide the sixth integral bit based at least on the sixth bit and the fifth integral bit previously provided. During the sixth time interval, the cancellation circuit can provide a sixth filtered proportional bit to the DCO based on the sixth proportional bit and the sixth shifted bit. The DCO can be configured to receive the sixth integral bit during the sixth time interval.

Figure 7:
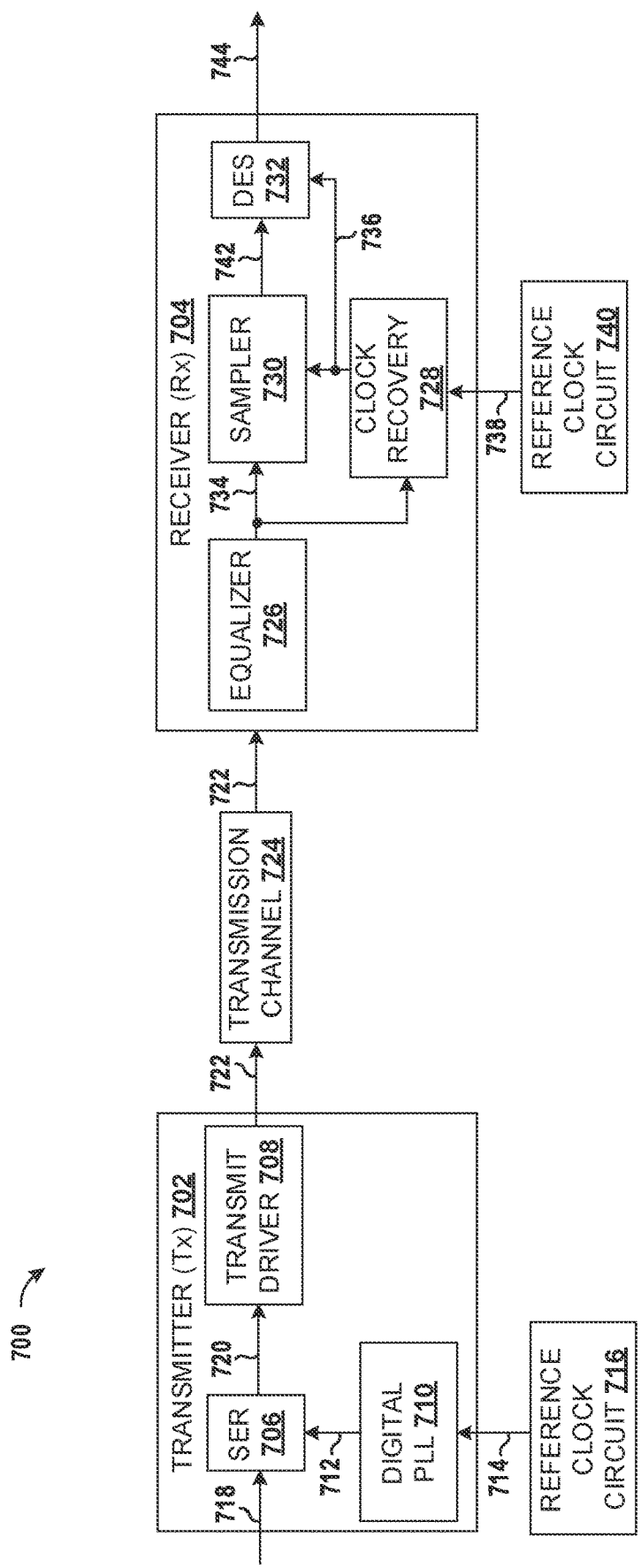
FIG. 7 is an example of a serial-link input/output (I/O) transceiver.

FIG. 7 is an example of a serial-link I/O transceiver 700. The serial-link I/O transceiver 700 includes a transmitter (Tx) 702 and a receiver (Rx) 704. The serial-link I/O transceiver 700 can be used for communication or transmission of data, for example, between one or more microprocessor cores and memory. As an example, the transmitter 702 can be employed at a microprocessor side (e.g., at a memory controller (e.g., as part of a data interface), within a corresponding microprocessor, etc.), and the receiver 702 can be employed at a memory side (e.g., at a memory device (e.g., as part of a data interface), etc.). Thus, in some instances, the serial-link I/O transceiver 700 can be used in high-speed data applications (e.g., memory device applications), for example, in a multi-gigabit range.

The transmitter 702 includes a serializer 706 (e.g., a multiplexer), a transmit driver 708, and a digital PLL 710. The digital PLL 710 can be implemented as the digital PLL 100, as shown in FIG. 1. Thus, in some examples, references can be made to the example of FIGS. 1-6 in the description with respect to FIG. 7. The digital PLL 710 can generate a clock signal 712 based on a first reference clock signal 714. In some examples, the clock signal 712 can be the output signal 108 received at output node 110, and the first reference clock signal 714 can be the reference input signal 104 received at the input node 102, as shown in FIG. 1. The first reference clock 714 can be provided by a first reference clock circuit 716. In some examples, the transmitter 702 can include the first reference clock circuit 716.

The serializer 706 can receive input data 718 and serialize (e.g., multiplex) the input data 718 into a sequence of bits 720 (or serialized set of bits) based on a frequency of the clock signal 712. The input data 718 can be representative of multiple data streams (e.g., sequence of bits) that can be provided over a respective channel to a respective input of the serializer 706 for serialization. The sequence of bits 720 can be received by the transmit driver 708, as shown in FIG. 7. The transmit driver 708 can provide a data stream 722 that includes the sequence of bits 720. The data stream 722 can be provided over a transmission channel 724 to the receiver 704. As an example, the transmission channel 724 can be a conductive trace or wire.

The receiver 704 includes an equalizer 726, a clock recovery 728, one or more samplers 730, and a deserializer 732. In some examples, the clock recovery 728 can include a digital PLL similar to the digital PLL 710. The equalizer 726 can receive the data stream 722 and apply equalization to compensate for transmission distortion and thus correct for attenuation characteristics of the transmission channel 724. The equalizer 726 can provide an equalized data stream 734 to the clock recovery 728 and the one or more samplers 730, as shown in FIG. 7. The clock recovery 728 can sample the equalized data stream 734 to recover a sampling clock signal 736 based on a second reference clock signal 738. The second reference clock signal 738 can be provided by a second reference clock circuit 740. The second reference clock circuit 740 can provide the second reference clock signal 738 with a similar frequency to the first reference clock signal 714 provided by the first reference clock circuit 716. In some examples, the receiver 704 can include the second reference clock circuit 740.

Once the sampling clock has been recovered, the sampling clock signal 738 can be provided to the one or more samplers 730. The one or more samplers 730 can sample the equalized data stream 734 based on the sampling clock signal 736 to generate a recovered bit stream 742. The recovered bit stream 742 can be provided to the deserializer 732 to recover the input data 718 as recovered input data 744, as shown in FIG. 7. The deserializer 732 can provide the recovered input data 744 based on the sampling clock signal 736.

As used herein, the term "circuit" can include a collection of active and/or passive elements that perform an electronic circuit function, such as an analog circuit and/or digital circuit. Additionally or alternatively, for example, the term "circuit" can include an IC where all or some of the circuit elements are fabricated on a common substrate (e.g., semiconductor substrate, such as a die or chip) or within a common package herein. For example, circuitry of a clock receiver circuit or a clock transmitter circuit as described herein (e.g., buffer circuits, scalers, buffer stages, and the like) can be implemented on a semiconductor substrate. Additionally, the term "couple" is used throughout the specification. The term may cover connections, communications, or signal paths that enable a functional relationship consistent with the description of the present disclosure. For example, if device A generates a signal to control device B to perform an action, in a first example device A is configured to device B, or in a second example device A is configured to device B through intervening component C if intervening component C does not substantially alter the functional relationship between device A and device B such that device B is controlled by device A via the control signal generated by device A.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
    a switch configured to provide a reference input signal having a first frequency in response to an output signal having a second frequency that is greater than the first frequency;
    a comparator configured to provide a series of bits based on the reference input signal and a comparator reference signal;
    proportional accumulator circuits configured to provide during respective different time intervals a proportional bit based on a respective bit of the series of bits and a previously outputted proportional bit by a respective proportional accumulator circuit, the proportional bit having an instantaneous value and an average value;
    shift registers configured during the respective different time intervals to shift the respective bit of the series to provide a shifted bit; and
    a cancellation circuit configured to output a filtered proportional bit during the respective different time intervals based on the proportional bit and the shifted bit to remove the average value from the proportional bit.

2. The circuit of claim 1, further comprising a digital controlled oscillator (DCO) configured to provide the output signal based at least on the filtered proportional bit with a similar frequency as the reference input signal.

3. The circuit of claim 2, wherein the comparator is one of a 1-bit quantizer that is configured to map an input amplitude of the reference input signal to an output amplitude of the respective bit.

4. The circuit of claim 2, further comprising an integral accumulator circuit configured to provide during each time interval of the respective different time intervals an integral bit based on the respective bit and a previously outputted integral bit.

5. The circuit of claim 4, wherein each proportional accumulator circuit is configured to provide a respective proportional bit during a respective time interval of the respective different time intervals in response to a respective frequency reference signal, and each shift register is configured to provide a respective shifted bit during the respective time interval of the respective different time intervals in response to the respective frequency reference signal.

6. The circuit of claim 5, wherein a first proportional accumulator circuit of the proportional accumulator circuits and a first shift register of the shift registers is configured to provide a first proportional bit and a first shifted bit, respectively, during a first time interval of the respective different time intervals based on a first bit of the series of bits; and
    a second proportional accumulator circuit of the proportional accumulator circuits and a second shift register of the shift registers is configured to provide a second proportional bit and a second shifted bit, respectively, during a second time interval of the respective different time intervals based on a second bit of the series of bits.

7. The circuit of claim 6, wherein the cancellation circuit is configured to:
    output a first filtered proportional bit during the first time interval based on the first proportional bit and the first shifted bit to remove an average value from the first proportional bit; and
    output a second filtered proportional bit during the second time interval based on the second proportional bit and the second shifted bit to remove an average value from the second proportional bit.

8. The circuit of claim 7, wherein the integral accumulator circuit is configured during the second time interval to output the integral bit based on the second bit of the bits and the previously outputted integral bit, the previously outputted integral bit corresponding to the first bit of the bits.

9. The circuit of claim 8, wherein a number of the proportional accumulator circuits and the shift registers are based on a ratio of the frequency of the output signal and the frequency of the reference input signal.

10. The circuit of claim 8, wherein circuit is implemented as a part of a serial-link input/output (I/O) transceiver for transmission of data.

11. A system comprising:
    a transmitter configured to provide a data stream based on a clock signal, the clock signal being generated by a digital phase-locked loop (PLL) circuit, the PLL circuit comprising:
        a switch configured to provide a reference input signal having a first frequency in response to the clock signal being provided by the PLL circuit, the clock signal having a second frequency that is greater than the first frequency;
        a comparator configured to provide a series of bits based on the reference input signal and a comparator reference signal;
        proportional accumulator circuits configured to provide during respective different time intervals a proportional bit based on a respective bit of the series of bits and a previously outputted proportional bit by a respective proportional accumulator circuit, the proportional bit having an instantaneous value and an average value;

shift registers configured during the respective different time intervals to shift the respective bit of the series to provide a shifted bit;

a cancellation circuit configured to output a filtered proportional bit during the respective different time intervals based on the proportional bit and the shifted bit to remove the average value from the proportional bit; and a digital controlled oscillator configured to provide the clock signal based at least on the respective filtered proportional bit with a similar frequency as the reference input signal.

12. The system of claim 11, wherein the transmitter includes the digital PLL and the reference input signal is generated by a reference clock circuit.

13. The system of claim 12, wherein each proportional accumulator circuit comprises an adder, the adder configured to add the respective bit of the series of bits to the previously outputted proportional bit to provide the proportional bit.

14. The system of claim 13, wherein each proportional accumulator circuit further comprises a delayer to provide the adder a delayed version of a previously received bit of the series of bits corresponding to the previously outputted proportional bit.

15. The system of claim 14, wherein the digital PLL further comprises an integral accumulator circuit configured to provide during each time interval of the respective different time intervals an integral bit based on the respective bit and a previously outputted integral bit.

16. The system of claim 15, wherein each proportional accumulator circuit is configured to provide a respective proportional bit during a respective time interval of the respective different time intervals in response to a respective frequency reference signal, and each shift register is configured to provide a respective shifted bit during the respective time interval of the respective different time intervals in response to the respective frequency reference signal.

17. A digital phase-locked loop (PLL) circuit comprising:
a digital controlled oscillator (DCO) having an input and an output;
a cancellation circuit having first and second inputs and an output, the output of the cancellation circuit coupled to the input of DCO;
a switch having an input coupled to the output of the DCO and an output;
a comparator having a first input coupled to the output of the switch, a second input coupled to the output of the DCO, and an output;
proportional accumulator circuits having respective first inputs coupled to the output of the comparator, respective second inputs coupled to respective outputs of a frequency synthesizer circuit, and respective outputs coupled to the first input of the cancellation circuit; and
shift registers having respective first inputs coupled to the respective outputs of the frequency synthesizer circuit, respective second inputs coupled to the output of the comparator, and respective outputs coupled to the second input of the cancellation circuit.

18. The digital PLL circuit of claim 17, wherein the input of the DCO is a first input, the DCO comprising a second input, the digital PLL circuit further comprising an integral accumulator circuit having an input coupled to the output of the comparator and an output coupled to the second input of the DCO.

19. The digital PLL circuit of claim 18, wherein the comparator is one of a 1-bit quantizer or a 2-bit quantizer.

20. The digital PLL circuit of claim 19, wherein the input of the switch is a first input, the switch comprising a second input, the digital PLL circuit further comprising an input node coupled to the second input of the switch, and an output node coupled to the output of the DCO.

\* \* \* \* \*